United States Patent [19]
Vale et al.

[11] Patent Number: 5,063,358
[45] Date of Patent: Nov. 5, 1991

[54] ULTRA LOW NOISE CRYSTAL OSCILLATOR CIRCUIT

[75] Inventors: Christopher R. Vale, Elk Ridge; Thomas S. Dominick, Glen Burnie; William R. Via, Dundalk; Gene P. Knapp, Sr., Glen Burnie, all of Md.

[73] Assignee: Westinghouse Electric Corp., Pittsburgh, Pa.

[21] Appl. No.: 608,069

[22] Filed: Nov. 1, 1990

[51] Int. Cl.⁵ ............................................. H03B 5/36
[52] U.S. Cl. ...................................... 331/60; 331/70; 331/116 R; 331/158
[58] Field of Search ........ 331/69, 70, 116 R, 116 FE, 331/158-164, 60

[56] References Cited
U.S. PATENT DOCUMENTS

| | | |
|---|---|---|
| 4,160,183 | 7/1979 | Kusters et al. ............. 331/116 R X |
| 4,859,969 | 8/1989 | Malinowski et al. ....... 331/116 R X |

*Primary Examiner*—Siegried H. Grimm
*Attorney, Agent, or Firm*—W. G. Sutcliff

[57] ABSTRACT

An ultra low noise oscillator circuit including a crystal and having two outputs. At the two outputs, the signal is correlated and the noise outside of the crystal bandwidth is decorrelated. Summing the two outputs in a hybrid circuit significantly reduces oscillator phase noise by almost 3 dB. In addition, these outputs can be used to perform a single oscillator noise test on the oscillator or crystal.

7 Claims, 9 Drawing Sheets

ULTRA LOW NOISE CRYSTAL OSCILLATOR CIRCUIT

BACKGROUND OF THE INVENTION

The present invention relates to an improved crystal oscillator circuit, and more particularly to an ultra low noise oscillator circuit. Previously, low noise oscillator circuits could provide −135 dbc in a 1 Hz bandwidth at 100 Hz offset from carrier. However, current communications and radar systems require signal sources that have greater spectral purity (e.g., lower phase noise) than previously obtainable. For example, in current radar systems noise in the radar signal source causes the position of targets to be blurred. One result of such blurring is that smaller adjacent targets appear as one, or are obliterated by a larger target due to the jittering of the target return (i.e. phase noise in the radar oscillator).

SUMMARY OF THE INVENTION

It is an object of the present invention to provide an ultra low noise, high Q crystal oscillator circuit.

It is another object of the present invention to provide an ultra low noise crystal oscillator circuit that does not significantly degrade the Q and noise of a crystal.

It is still a further object of the present invention to provide an ultra low noise, high Q crystal oscillator circuit employing a BT cut crystal.

It is still a further object of the present invention to provide an ultra low noise, high Q crystal oscillator circuit having substantially reduced amplitude limiting.

It is still a further object of the present invention to provide a ultra low noise, high Q crystal oscillator circuit having an improved signal-to-noise ratio output.

To achieve the above and other objects, the present invention provides an ultra low noise, high Q oscillator circuit comprising a crystal having first and second terminals; an oven for heating the crystal; an oscillator sustaining circuit having an input connected to the first terminal and an output; a first amplifier having a second output and being connected to the first output of the oscillator sustaining circuit; a second amplifier having a third output and being connected to the second terminal of the crystal. In a preferred embodiment of the present invention, the oscillator sustaining circuit includes an automatic level and gain control circuit that enables amplitude limiting to be minimized. As a result, the affect of the circuit on the Q of the crystal is minimized, and signal to noise ratio at the oscillator sustaining circuit is not degraded.

DETAILED DESCRIPTION OF THE PREFERRED EMBODIMENT

Figure 1:
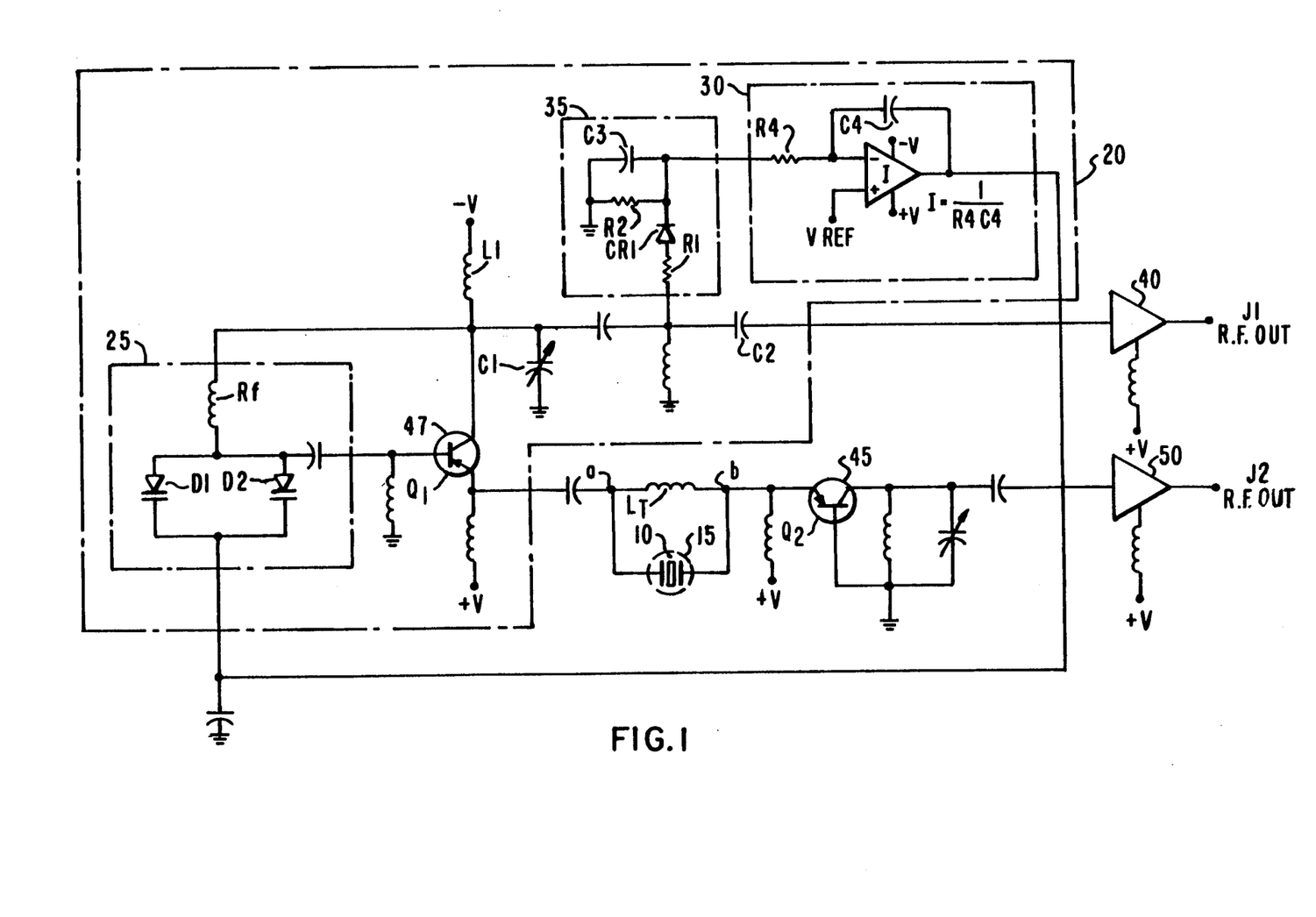
FIG. 1 is a simplified schematic diagram of an ultra low noise, high Q oscillator circuit embodying the present invention.

FIG. 1 is a schematic diagram of a high Q, low noise crystal oscillator circuit embodying the present invention. FIG. 1 is a modified Butler-type crystal oscillator including automatic level and gain control circuitry. In FIG. 1, reference numeral 10 identifies a crystal having a first terminal "a" and a second terminal "b." In a preferred embodiment of the present invention, the crystal 10 comprises a BT-cut crystal manufactured by Piezo Crystal Company of Carlisle Pa. The characteristics of the crystal 10 include a fifth overtone crystal having an operating frequency of 37.6 MHz±200 Hz at a temperature of 60° C.±3° C. In a preferred embodiment of the present invention, the crystal 10 has a TO8 mounting, a Q≧625,000 and a motional inductance of 200 mH±15%. As shown in FIG. 1, a tuning inductance $L_T$ is connected in parallel with the crystal 10. The value of the tuning inductance $L_T$ is selected to null the crystal capacitance "$C_0$" at the desired oscillator frequency.

Figure 6:
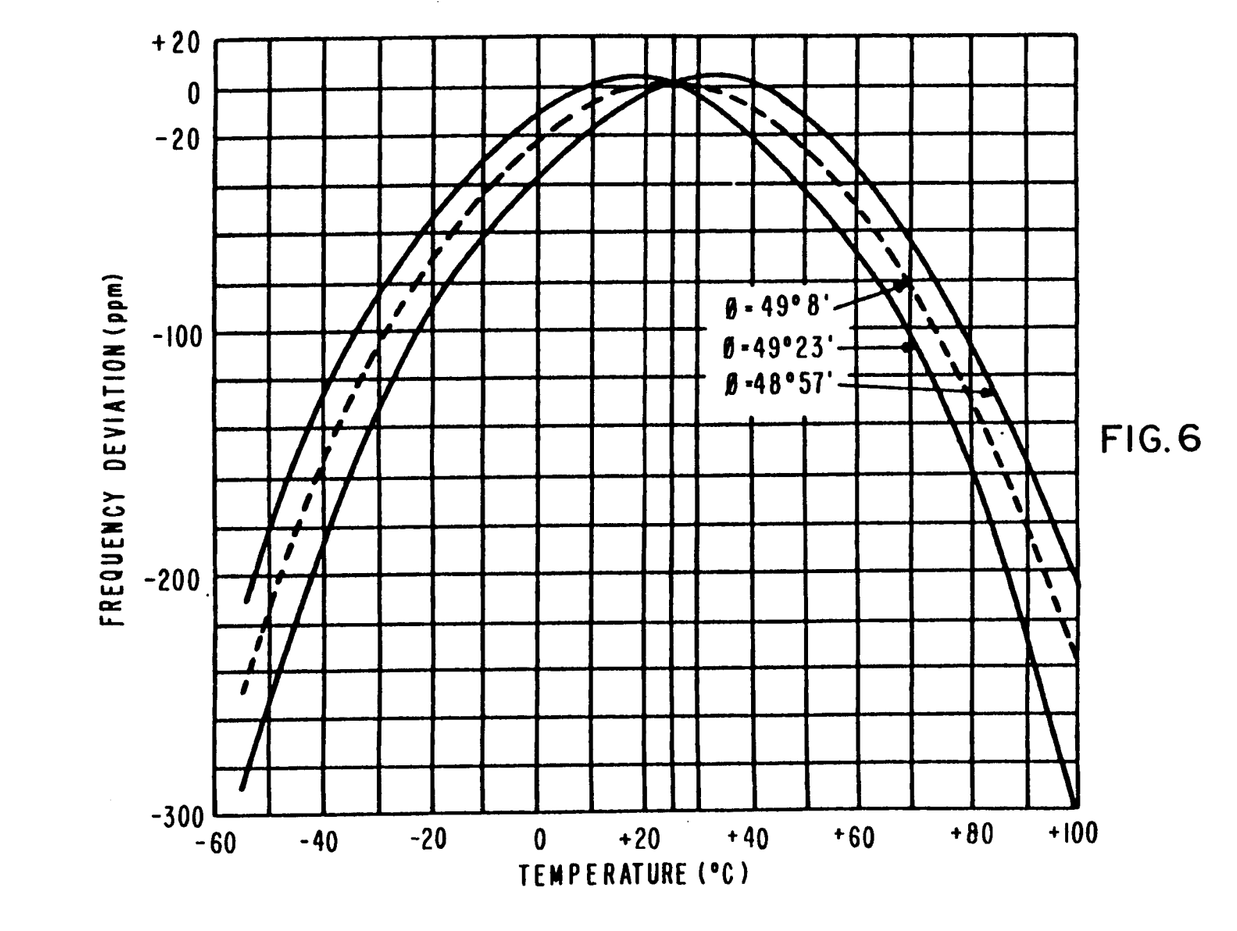
FIG. 6 is a graph illustrating the frequency/temperature characteristics of a BT cut crystal.

FIG. 6 is a graph illustrating the frequency/temperature characteristics of a BT-cut crystal. As seen from FIG. 6, one of the primary reasons BT cut crystals are not used in crystal oscillators is because of the steep parabolic shape of the frequency versus temperature characteristic. As seen in FIG. 6, for a ±50° C. change from the inflection point of the BT crystal, the frequency of the crystal changes almost 100 ppm. The temperature at which the frequency shift is zero can be accurately controlled by varying the cutting angle of the BT crystal. The three curves shown in FIG. 6 show that for +2' departure from the standard angle of −49°8' (e.g., rotating the plane angle from the Z axis towards the Y axis), the turnover point changes by approximately 1° C. Using this, the BT crystal can be made to have a turnover temperature that is higher than the highest temperature at which the crystal is expected to operate in any given system application.

To maintain the crystal 10 at the appropriate temperature for maximum frequency stability, the preferred embodiment of the present invention includes an oven 15. It is not necessary that the whole circuit operate at the elevated temperature. Thus, a greatly simplified oven which is more economical can be used. A commercially available miniature quartz crystal oven for a TO8 crystal can hold the temperature of the crystal within ±3° C. of 60° C. while the ambient temperature ranges between −10° C. and +50° C. One such oven is manufactured by Ovenaire and has Model No. HC537-15-60. The temperature versus frequency characteristic of a BT crystal employed in the present invention having a turnover temperature of approximately 60° has a parabolic frequency versus temperature curve approximated by $$\frac{\Delta f}{f_0} = K (\Delta T)^2$$

Where:
fo is the turnover resonant frequency
Δf is the frequency shift due to temperature
ΔT is the excursion of temperature from the turnover temperature.
and
K is a constant which equals - $3.688 \times 10^{-8}$/(Centigrade degree)$^2$.

The oven 15 can therefore hold the crystal frequency to within 0.33 ppm over the $-10°$ C. to $+50°$ C. temperature range. Normally, the Q of a crystal decreases with higher operating temperatures. However, we have discovered that with fifth overtone BT cut crystals operating at 37.656 MHz and having a turnover temperature of 60° C., the Q increased with increases in temperature. The Q increases ranged from 50 to 90% for the various crystals tested.

Referring to FIG. 1, the first terminal "a" of the crystal 10 is connected to an oscillator sustaining circuit 20. The oscillator sustaining circuit 20 includes a variable gain network 25 and an integrator circuit 30 that includes a detector 35. Together the variable gain network 25, integrator circuit 30 and detector circuit 35 function as an automatic level and gain control circuit that is used to sustain oscillation. This circuit minimizes the amount of limiting needed in the oscillator circuit of the present invention. For example, with a circuit embodying the present invention only about 0.1 dB limiting is needed. This is in contrast to conventional oscillator circuits which need limiting in the range of 3 to 5 dB. The higher limiting of conventional oscillator sustaining circuits adversely affects the Q, the noise characteristics and output signal power of an oscillator.

The output of the integrator 30 controls the voltage across the variable gain network 25, and more specifically across the varactors D1 and D2. Typically, a voltage range of 2 to 20 volts can be achieved in a circuit using ±12 volt power supplies. The following equations show that such a voltage range provides a gain control range of 10 dB and that it can be achieved in an oscillator embodying the present invention. This voltage range is more than sufficient to handle normal gain changes that are a result of component tolerances and component changes caused by time and temperature variations.

$C_v = K/\sqrt{V_i}$ = Varactor Capacitance

K = Constant
$V_i = V1 = 20$ Volts
$V_i = V2 = 2$ Volts $\Delta C_v = \dfrac{V1}{\sqrt{V2}} = \dfrac{20}{\sqrt{2}}$ = Capacitance Range Gain Control Range = $20 \log_{10} \sqrt{10} = 10$ dB
where $C_v$ = Varactor Capacitance
$V_i$ — voltage across the varactor; and
$\Delta C_v$ = Capacitance Range Referring to FIG. 1, the output of the integrator circuit 30 controls the voltage across the variable gain network 25; and thus, the feedback voltage applied to Q1. The inputs to the integrator circuit 30 are a voltage reference of 4.5 VDC and a detected RF output voltage of the transistor Q1 provided by detector 35. The integrator circuit 30 functions to adjust the voltage across the varactors (D1, D2) (and thus the impedance of varactors D1 and D2). As noted above, varying the varactor voltage actually adjusts the loop gain and oscillator output level so that the detected RF level is the same as the reference level. We have determined that an output level of approximately 10 volts peak to peak is optimum for low noise operation of the disclosed circuit. In the disclosed circuit, the output level voltage swing is approximately two times the sum of the reference voltage plus a diode voltage drop across CR1.

Referring to FIG. 1, in a preferred embodiment of the present invention, the Q of the circuit at the collector of Q1 is approximately 10. This value is determined by the resistive load of Q1 and the total shunt capacitance comprising stray capacity, the capacitance of a tuning capacitor C1 and the capacitance of an impedance transformation capacitor C2. The capacitor C2 transforms a nominal 50Ω input impedance of a first amplifier 40 to approximately 20 times the resistance of the crystal 10; thereby, achieving a 13 dB power gain. Thus, with a 0.5 milliwatt dissipation in the crystal, power at the collector of Q1 is approximately 10 milliwatts. This output power is set and maintained by the automatic level and gain control circuitry including the variable gain network 25, detector circuit 35 and integrator circuit 30.

As is well known in an oscillator circuit, a small amount of amplitude limiting is needed to maintain amplitude stability. In the FIG. 1 circuit, the amount of limiting is primarily determined by R2. Since the voltage across R2 is a DC voltage equal to the reference voltage, the amount of power lost to limiting is $$P_{LIMIT} = \dfrac{[Vref]^2}{R2}$$

In a preferred embodiment of the present invention, if R2 has a resistance of 100 KΩ and the reference voltage applied to the integrator circuit ($V_{ref}$) is 4.5 volts, then $$P_{LIMIT} = 200 \times 10^{-6} \text{ watts} = 0.2 \times 10^{-3} \text{ watts}$$

As noted above, the power developed at the collector of Q1 is 10 milliwatt; thus the amount of limiting is $$\text{Limiting} = 10 \, LOG_{10} \dfrac{10 \times 10^{-3} \text{ watt}}{(10 - 0.2) \times 10^{-3} \text{ watt}} \text{ or}$$

$$\text{Limiting} \approx 0.09 \, dB$$

The first amplifier 40 amplifies the output of the oscillator sustaining circuit 20. Typically, amplifiers have noise figures of approximately 6 dB. The signal applied to the first amplifier 40 has a strength of approximately 10 dBm which is large enough so that the oscillator noise level is not significantly affected by the noise introduced by the first amplifier 40. This is in contrast to conventional oscillators which use approximately 5 dB of limiting. In such a case, the signal applied to an output amplifier, such as the first amplifier 40, would only be approximately 5 dBm because of the conventional 5 dB limiting. Consequently, since a typical amplifier noise figure is approximately 6 dB, the amplifier noise would cause a significant increase in overall oscillator noise. This is especially true if the oscillator noise floor was close to the thermal noise; that is, close to kTB where K is Boltzman's constant T is the temperature in °K and B is the bandwidth of interest which is normally 1 Hz.

Referring to FIG. 1, a second terminal "b" of the crystal 10 is connected to the emitter of a transistor 45. The input impedance of the transistor 45 is typically in the range of 5Ω–10Ω. Because this is low compared to typical crystal resistances (e.g., 50Ω–80Ω), connecting the terminal "b" to the transistor 45 degrades the Q of the oscillator by less than approximately 10%. A second amplifier 50 amplifies the output of the transistor 45. In a preferred embodiment of the present invention, the second amplifier 50 provides approximately 13 dB gain. In the FIG. 1 oscillator circuit, the signal flowing through a transistor 47 that is connected to the first end "a" of the crystal 10 also flows through the transistor 45. However, the crystal 10 acts as a filter to any noise generated in the oscillator sustaining circuit 20. In a preferred embodiment of the present invention, the first and second amplifiers (40, 50) comprise Model No. QBH215 amplifiers manufactured by Q-BIT Corporation, Palm Bay, Fla.

Figure 3:
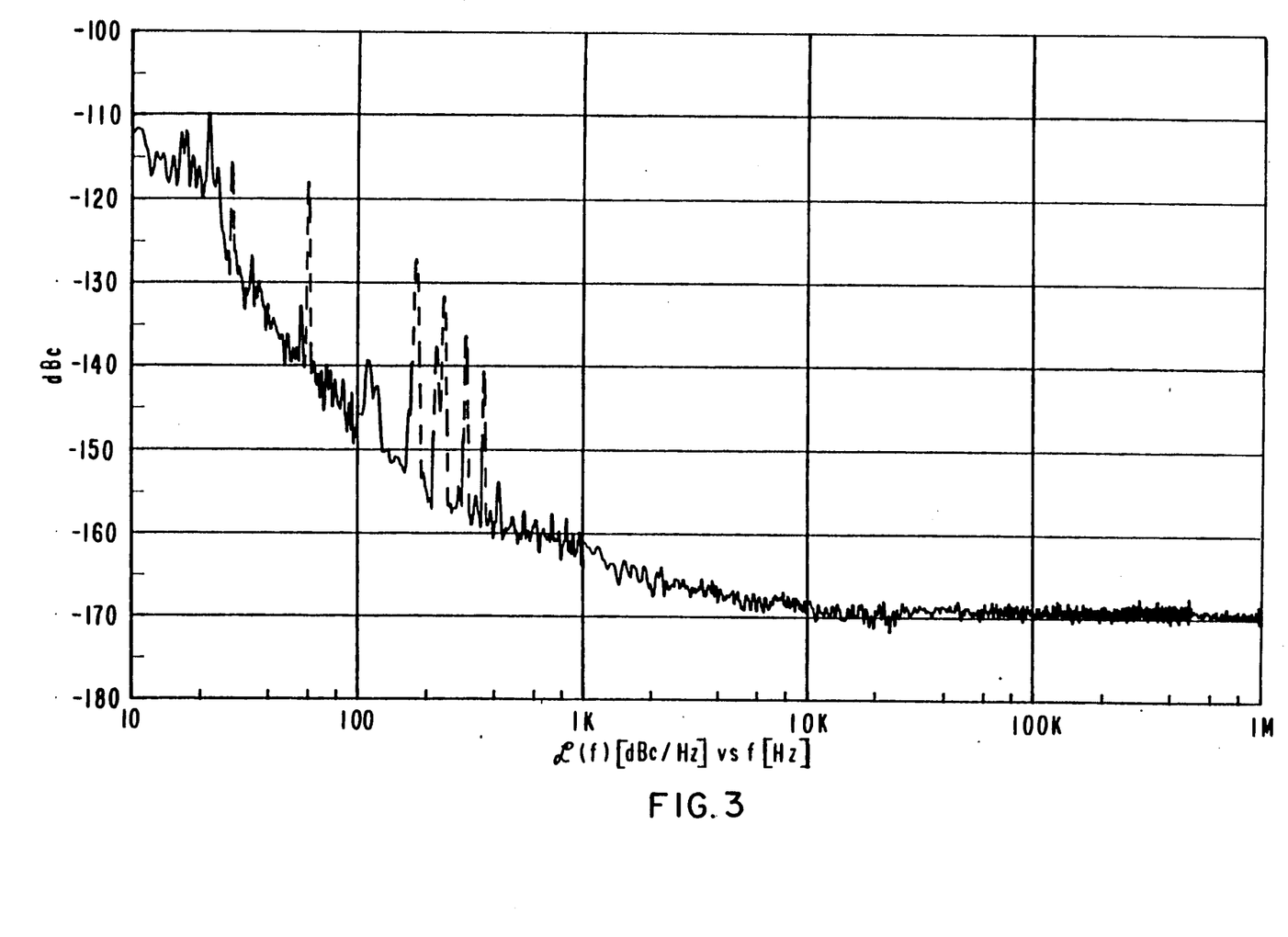
FIG. 3 is a graph illustrating phase noise measured at a first output of the FIG. 1 circuit.
Figure 4:
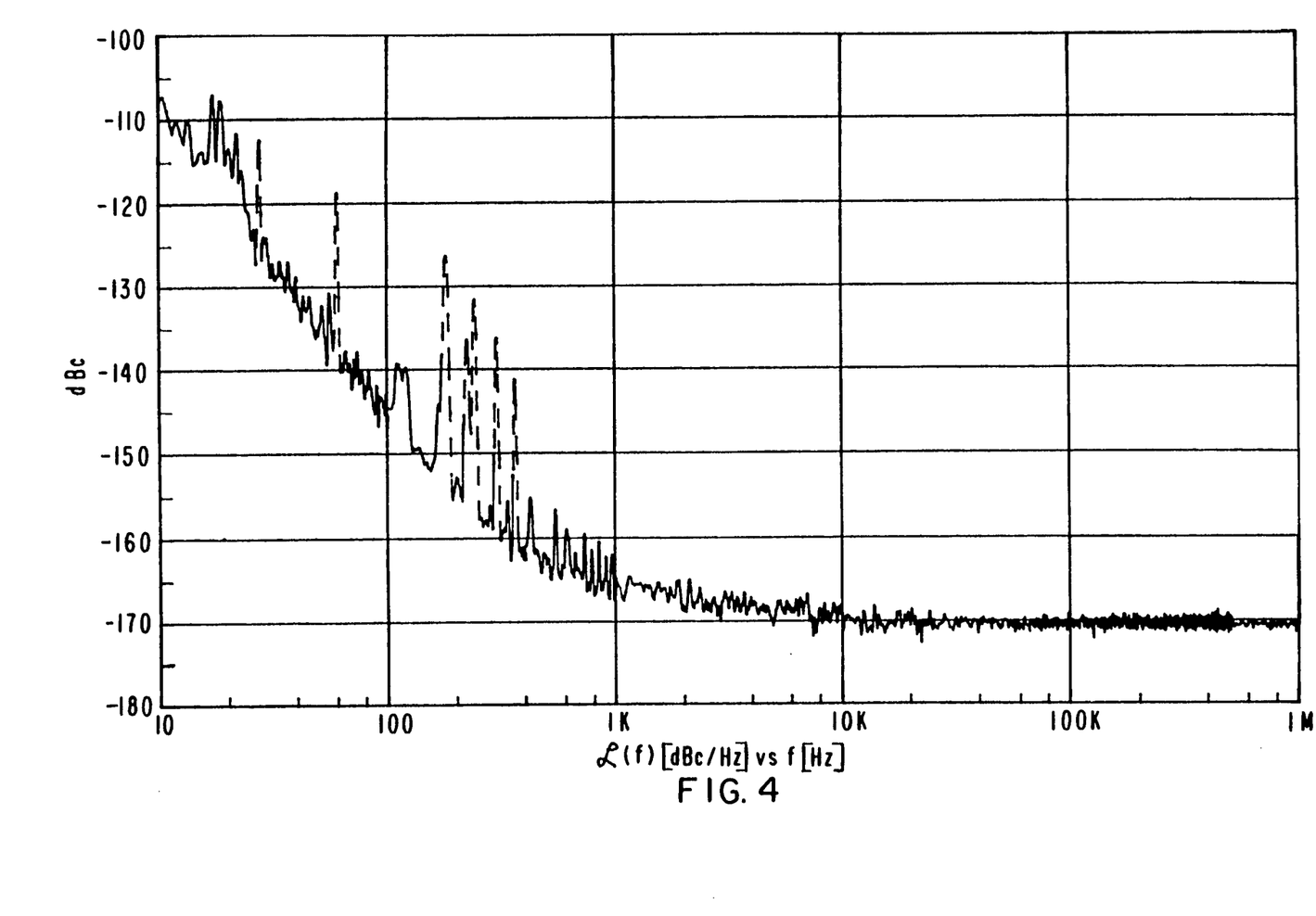
FIG. 4 is a graph illustrating phase noise at a second output of the FIG. 1 circuit.

Because the oscillator in accordance with the present invention has reduced limiting (e.g., 0.1 dB in the oscillator sustaining circuit 20), the output of the first amplifier 40 is basically the same as the output of the second amplifier 50 and has approximately the same noise characteristics. This is seen with reference to FIGS. 3 and 4. More particularly, FIG. 3, is a graph illustrating phase noise measured at a first output of the FIG. 1 circuit, and FIG. 4, is a graph illustrating phase noise at a second output of the FIG. 1 circuit. The data in these figures was obtained by beating a fixed crystal oscillator with a voltage controlled crystal oscillator and analyzing the resultant signal using a Hewlett Packard noise analysis system Model No. HP11740A. The data in FIGS. 3 and 4 was taken using a BT cut crystal oscillating at a frequency of 37.6 MHz. In making the measurements, the crystal power dissipation was at less than 0.5 milliwatt. We believe that BT cut crystals may be able to handle power levels similar to that of SC cut crystals (+5 to 7 dBm). Higher power dissipation by BT cut crystals would provide further reduction in noise in oscillator circuits embodying the invention due to attaining a higher signal to noise ratio. The high Q crystal causes the noise of the two outputs to be decorrelated, but leaves the signal at the two outputs correlated. Thus, adding the two outputs results in a significant noise reduction as discussed below.

Figure 2:
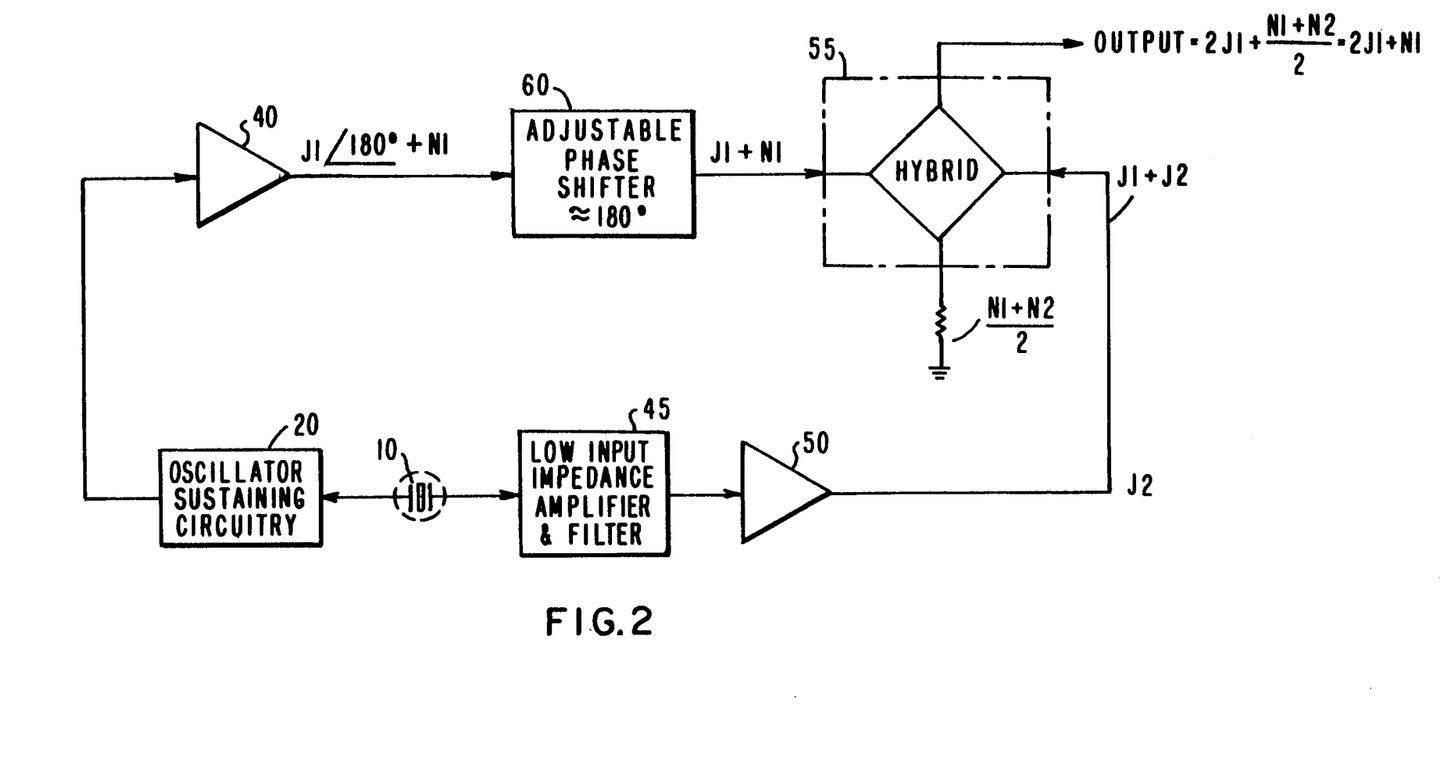
FIG. 2 is a block diagram of a high Q, ultra low noise crystal oscillator circuit embodying the present invention.

FIG. 2 is a schematic block diagram of an ultra low noise, high Q oscillator circuit in accordance with the present invention. In FIG. 2, the outputs of the first and second amplifiers (40, 50) are summed in a hybrid combiner or summer 55. An adjustable phase shifter 60 compensates for the phase difference resulting from the physical size of the circuit board, which in an embodiment of the present invention is about 10"×10". The adjustable phase shifter 60 can comprise any phase shifting circuit, and need not be adjustable. In an embodiment of the invention the adjustable phase shifter 60 comprises a General Radio phase shifter having Model No. 874LT. In an embodiment of the present invention, the hybrid combiner or summer comprises a summer having Model No. H109 manufactured by ANZAC of Burlington, Mass.

Figure 5:
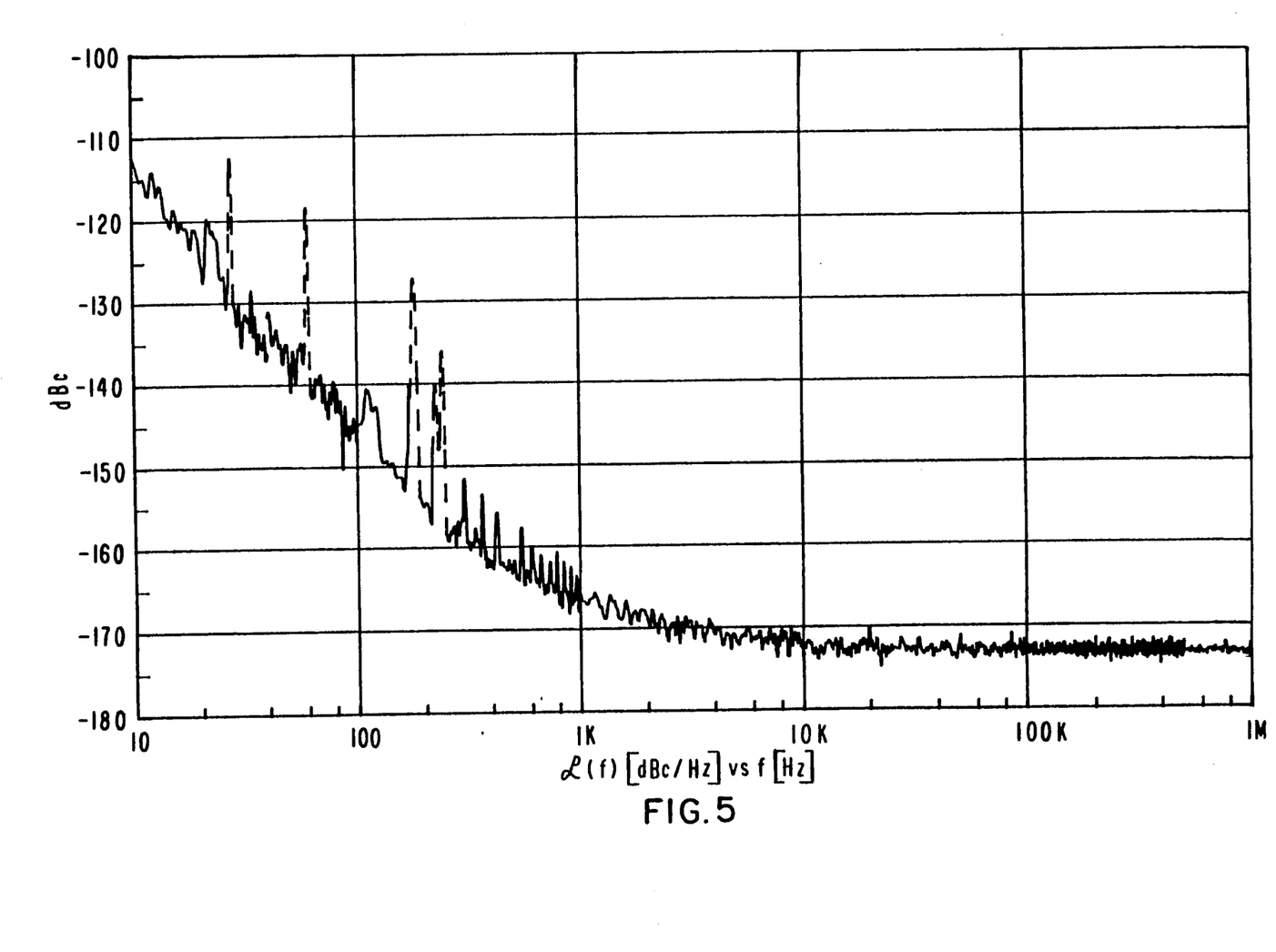
FIG. 5 is a graph showing the phase noise at the output of the FIG. 2 circuit.

FIG. 5 is a graph showing the noise at the output of the FIG. 2 circuit. The integrated noise over a range of 50 Hz to 450 KHz offset from carrier frequency is shown in following table:

| Output | Integrated Noise Integrated Noise Level |
|---|---|
| first amplifier 40 | −110.9 dBc |
| second amplifier 50 | −111.6 dBc |
| hybrid summer 55 | −113.9 dBc |

As seen from the above table, there is a 2.3 dBc improvement in the phase noise at the output of the hybrid combiner or summer 55 compared to the individual outputs of the first and second amplifiers (40, 50). Theoretically, this increase should be 3 db. Further refining of experimental circuitry should approach this value.

The FIG. 1 circuit can also be used to verify noise performance of a crystal 10 without the need for a voltage controlled crystal oscillator to beat the signal. Normal industry standard phase noise testing using the HP 11740A test set requires the use of two separate crystal oscillator circuits. Our invention requires only one, non-voltage-controlled oscillator to, in effect, "self test" the oscillator or crystal.

Figure 7:
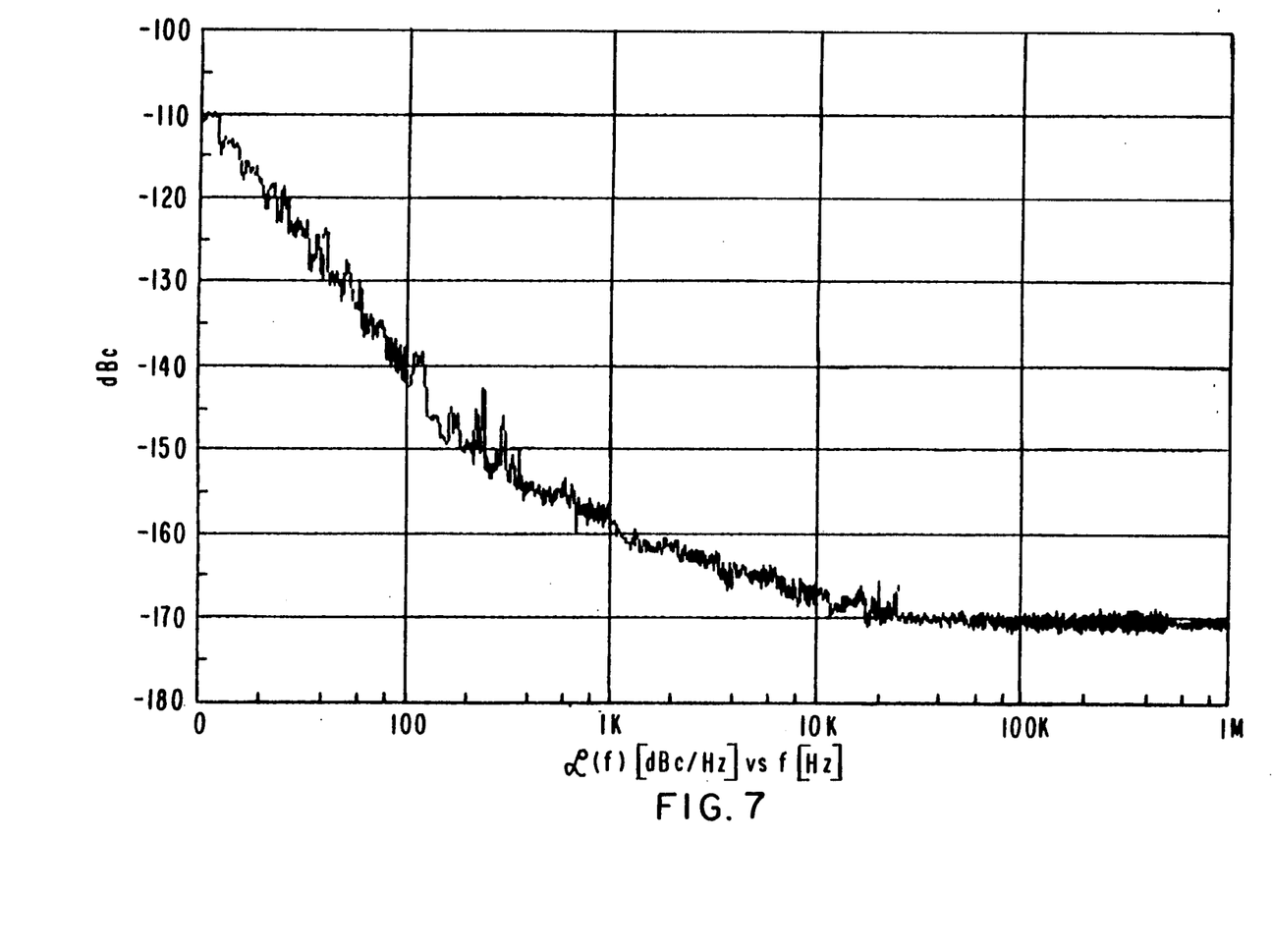
FIG. 7 is a graph illustrating phase noise of a noisy crystal at the output of the FIG. 1 circuit.
Figure 8:
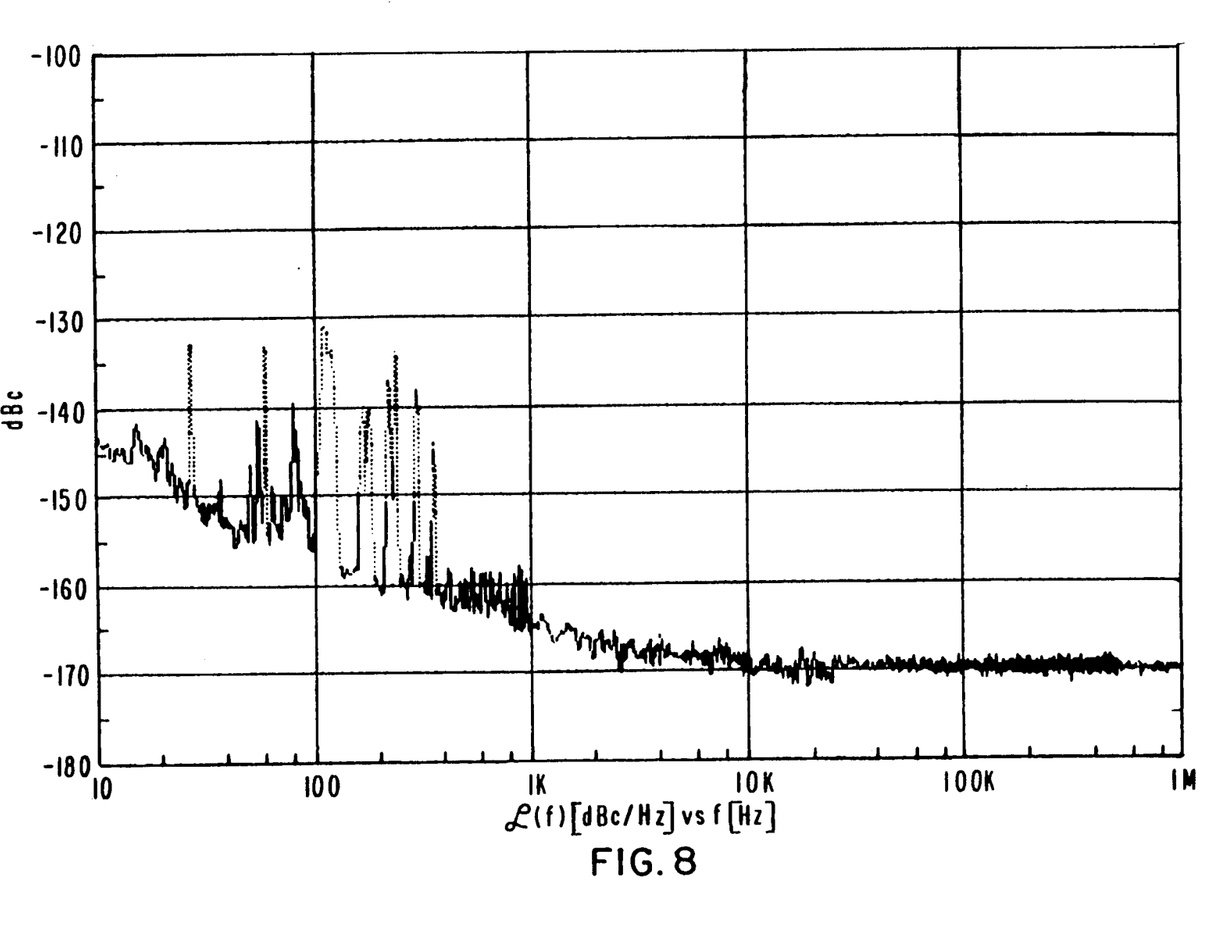
FIG. 8 is a graph illustrating phase noise of a good crystal at the output of the FIG. 1 circuit.

FIGS. 7 and 8 illustrate the phase noise measurements of a noisy crystal and a good crystal, respectively. As with FIG. 3, 4 and 5, these measurements are based on a BT cut crystal oscillating at a frequency of 37.6 MHz. Referring to FIG. 8, the noise curve is similar to that of FIGS. 3 and 4. For frequencies less than 200 Hz, FIG. 8 shows less noise than FIGS. 3 and 4. This reduced noise results from the noise signals becoming increasingly correlated and cancelling in the HP11740A phase noise test set. FIG. 7 illustrates the resultant phase noise for a poor quality crystal, and serves to verify the noise measurement technique using the FIG. 1 system.

Figure 9:
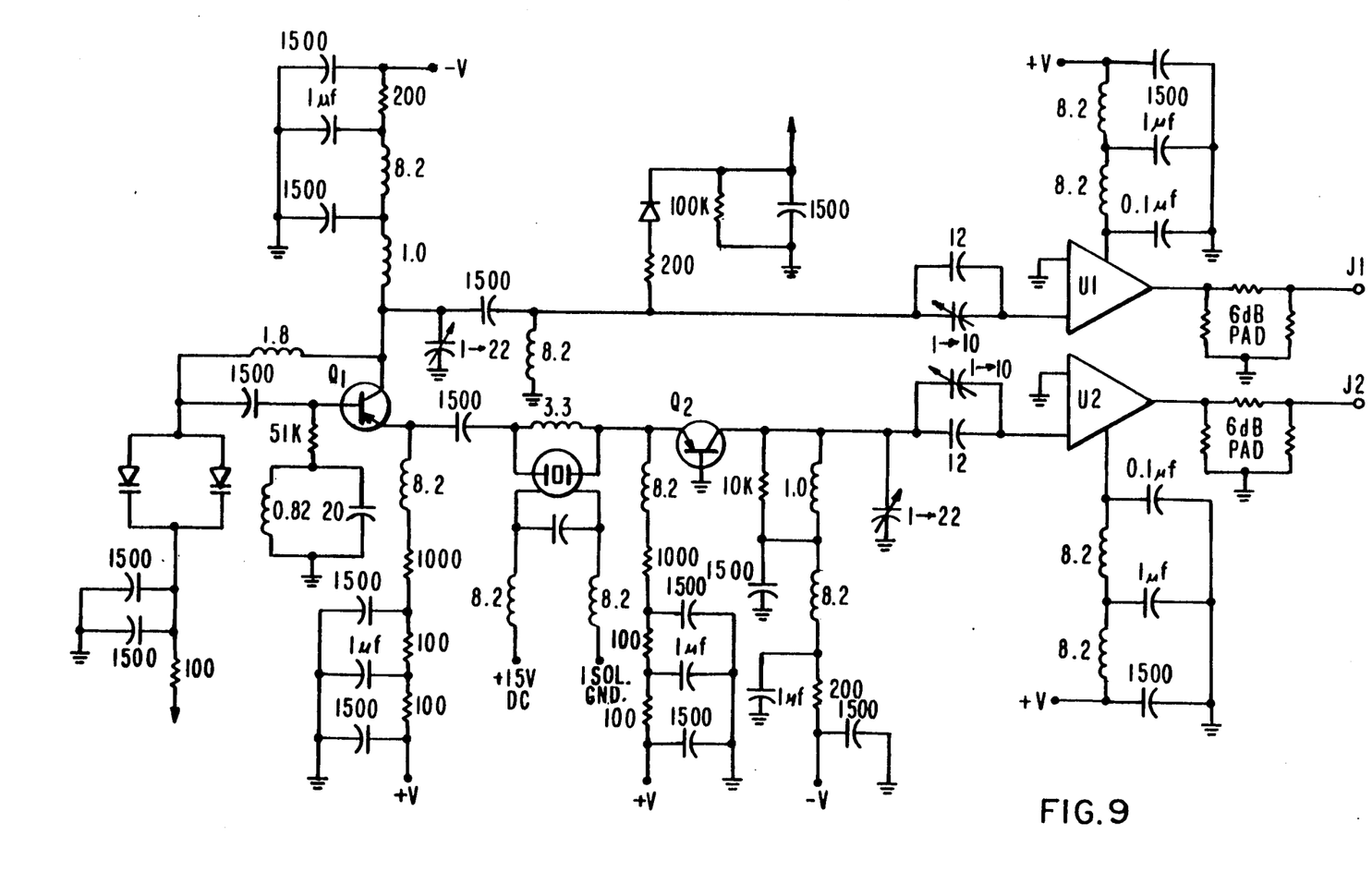
FIG. 9 is a detailed schematic diagram of the FIG. 1 circuit.

FIG. 9 is a detailed circuit diagram of an embodiment of the FIG. 1 oscillator circuit. In FIG. 9, resistances are shown in ohms, inductances are expressed in micro henrys and capacitances are expressed in picofarads.

In the above, the preferred embodiment of the present invention includes a BT cut crystal having a Q of at least 625,000 as discussed above. The present invention, however, can include any other resonator. It is not necessary to have an extremely high Q resonator. The invention works with any resonator. But, of course, it works better with a very high Q resonator, such as a resonator having a Q times frequency product of at least $2.5 \times 10^{13}$.

While the present invention has been described with respect to a particular physical embodiment, the invention is not limited to the particulars described above; instead, the scope of the invention is defined by the following claims.

We claim:

1. An ultra low noise oscillator circuit having first and second outputs comprising:
    a crystal having first and second terminals;
    heating means for heating said crystal;
    an oscillator sustaining circuit having an output and having an input operatively connected to said first terminal;
    a first amplifier having an output corresponding to the first output of said oscillator circuit, and being operatively connected to said output of said oscillator sustaining circuit; and
    a second amplifier having an output corresponding to the second output of said oscillator circuit, and being operatively connected to said second terminal.

2. An ultra low noise oscillator circuit according to claim 1, wherein said crystal has a Q times frequency product of at least $2.5 \times 10^{13}$.

3. An ultra low noise oscillator circuit according to claim 1, further comprising an inductor connected in parallel with said crystal and wherein said crystal comprises a BT cut crystal.

4. An ultra low noise oscillator circuit according to claim 3, wherein said oscillator sustaining circuit comprises:
 a variable gain network having a gain and being operatively connected to said first terminal; and
 an integrator connected to said variable gain network so as to vary the gain of said variable gain network.

5. An ultra low noise oscillator circuit according to claim 4, wherein said variable gain network comprises at least one varactor.

6. An ultra low noise oscillator circuit according to claim 4, further comprising a detector circuit operatively connected between said variable gain network and said integrator network.

7. An ultra low noise oscillator circuit according to claim 3, further comprising:
 a summing circuit having at least two inputs respectively coupled to said output of said first amplifier and said output of said second amplifier.

* * * * *